United States Patent [19]

Iijima

[11] 4,109,161

[45] Aug. 22, 1978

[54] MEMORY CIRCUIT WITH PROTECTION CIRCUIT

[75] Inventor: Hiroshi Iijima, Tokyo, Japan

[73] Assignee: Nippon Electric Company, Ltd., Tokyo, Japan

[21] Appl. No.: 766,815

[22] Filed: Feb. 8, 1977

[30] Foreign Application Priority Data

Feb. 9, 1976 [JP] Japan ................................. 51-13055

[51] Int. Cl.² .............................................. G11C 7/02
[52] U.S. Cl. ......................................... 307/87; 361/92
[58] Field of Search .......................... 307/131, 87, 43; 361/92, 88; 340/172.5

[56] References Cited

U.S. PATENT DOCUMENTS 3,624,617  11/1971  Putterman et al. ..................... 361/92

Primary Examiner—Herman J. Hohauser
Attorney, Agent, or Firm—Sughrue, Rothwell, Mion, Zinn and Macpeak

[57] ABSTRACT

A memory circuit with protection circuit having particular application to MOS-IC memories is disclosed. The protection circuit prevents the memory from being damaged by an undesirable turn-on or turn-off sequence of main and substrate voltage supplies or by an abnormal substrate voltage.

3 Claims, 3 Drawing Figures ics constituting a frame memory, the switch for the main voltage is closed to enable the operation. Thus, the memories $M_1$ to $M_n$ can be protected by the single protection circuit, even if the above-mentioned wiring

MEMORY CIRCUIT WITH PROTECTION CIRCUIT

BACKGROUND OF THE INVENTION

This invention relates to a memory circuit for use in a video signal processing circuit and, more particularly, to an MOS-IC (metal oxide semiconductor-integrated circuit) memory circuit capable of frame-by-frame storage of a video signal, i.e., the so-called frame memory circuit.

The frame memory used for the frame-by-frame storage of the video signal is composed of several hundred chips of MOS-IC's each having 4,000-bit memory capacity. A substrate voltage ($V_{SUB}$) as well as a main voltage ($V_{DD}$) should be supplied to the MOS-IC. In this case, the main voltage should be impressed to the MOS-IC, after the substrate voltage is supplied thereto. In case the main voltage is impressed before the substrate voltage is supplied, the MOS-IC will be damaged and can no longer be used again. For this reason, a time sequentially operating switch has been required for a power source for a conventional system. When the power source is turned on, the time sequentially operating switch supplies the main voltage after the substrate voltage is supplied. When the power source is turned off, the switch cuts off the main voltage before the substrate voltage is cut off. However, even if the switch operates normally, the memory is damaged if the substrate voltage is lowered during the operation or is no longer supplied to the memory due to defective contact of a connector and the like. In addition, a conventional time sequentially operating switch having a combination of switches with relays is large in size.

SUMMARY OF THE INVENTION

It is an object of the present invention to provide an MOS-IC memory circuit which is accompanied with a simple protecting circuit therefor, the protection circuit preventing the memory from being damaged by an undesirable turn-on or turn-off sequence of the main and substrate voltage supplies or by an abnormal substrate voltage.

BRIEF DESCRIPTION OF THE DRAWINGS

The memory protecting circuit according to the present invention will now be described in more detail with reference to the accompanying drawings, wherein.

DESCRIPTION OF THE PREFERRED EMBODIMENTS

Figure 1:
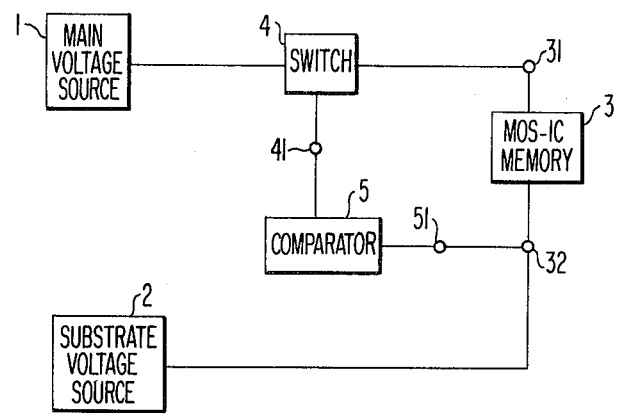
FIG. 1 is a block diagram showing a first embodiment of the present invention.

Referring to FIG. 1, reference numerals 1 and 2 are main and substrate voltage sources, respectively; 3, an MOS-IC memory having first and second power source input terminals 31 and 32; 4, a switch having a control input terminal 41; and 5, a comparator. The output terminal of the source 2 is connected to the input terminal 32 as well as to an input terminal 51 of the comparator 5, while the output terminal of the comparator 5 is connected to the control input terminal 41 of the switch 4. The comparator 5 provides a control output when the substrate voltage is lower than a given voltage level, thereby opening the switching circuit 4 for immediately interrupting the supply of the main voltage to the memory 3. The given voltage level is set at a lower limit voltage which is allowable as the substrate voltage.

When the power source is turned on, the substrate voltage is first built up, and when the substrate voltage exceeds the given voltage level, the switch 4 is closed. The switch 4 maintains its closed condition, as long as the substrate voltage is normally applied thereon.

Figure 2:
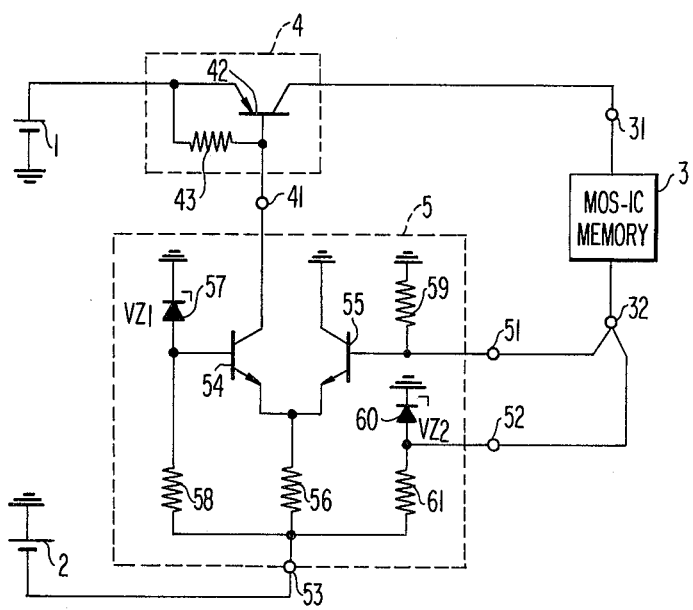
FIG. 2 is a circuit diagram illustrative of the detailed circuit to FIG. 1.

FIG. 2 is a circuit diagram illustrative of the detailed arrangement of the circuit shown in FIG. 1. The switching circuit 4 consists of a transistor 42 and a resistor 43 for providing a forward bias between the emitter and the base of the transistor 42. The comparator circuit 5 comprises a current switching circuit consisting of transistors 54, 55 and a resistor 56, a zener diode 57 having a zener voltage VZ1 and being connected to the base of the transistor 54, a resistor 59 connected between the base of the other transistor 55 and the ground; and an input terminal 51. A voltage supplied from a voltage source 2' to the input terminal 53 is fixed by a zener diode 60 at a zener voltage VZ2 and a resistor 61, to provide the substrate voltage at an output terminal 52, at the substrate input terminal 32 of the memory 3, and at an input terminal 51. The zener voltage VZ1 is equal to the allowable lower limit voltage of the substrate voltage, while VZ2 is equal to a normal substrate voltage (VZ1<VZ2), so that the transistor 54 is normally in the on-state, and the transistor 55, in the off-state. Thus, a current flows by way of a resistor 43 in the switch 4 to the transistor 54, so that the transistor 43 is forwardly biased to be conductive, thereby supplying the main voltage to the memory 3. When the substrate voltage is lowered or cut off due to defective contact of a connector or the like, then the transistor 55 is turned on, and the transistor 54 is turned off. As a result, the transistor 42 is immediately turned off, so that the application of the main voltage for the memory 3 is interrupted, and hence the memory 3 is automatically protected.

Since the comparator 5 may be actuated with a small amount of a current of several milli-amperes, and the switch 4 effects only on-off operation, power consumption of those circuits is small. Therefore, small-sized transistors and resistors can be used and thus built in a common circuit board together with control circuits used for the memory 3.

Figure 3:
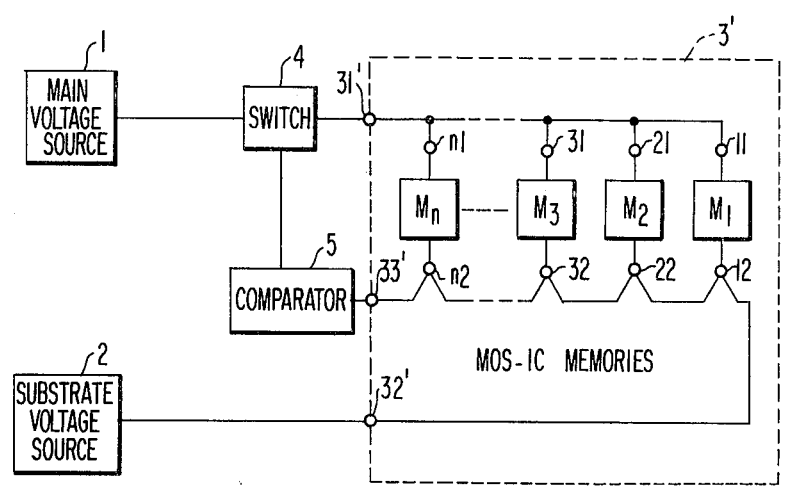
FIG. 3 is a block diagram illustrative of a second embodiment of the present invention.

FIG. 3 is a block diagram of the second embodiment of the present invention. Reference numerals 1, 2, 4 and 5 designate like parts as those of FIG. 1. The memory circuit 3' consists of memories $M_k$ of the number n (k = 1,2,3 ... n), a main voltage input terminal 31', a substrate voltage input terminal 32', and a substrate voltage output terminal 33'. Each of memories $M_k$ has a main voltage input terminal K1 and a substrate voltage input terminal k2. The main voltage input terminals 11 to n1 of respective memories are connected to the main voltage input terminal 31', while the wiring from the terminal 32' to the terminal 33' is done via all the substrate voltage input terminals 12 to n2 of respective memories. Thus, a single comparator may be used to detect a given substrate voltage applied to all the memories. Only when the normal substrate voltage is applied to the substrate input terminals of several hundreds of MOS-ICs constituting a frame memory, the switch for the main voltage is closed to enable the operation. Thus, the memories $M_1$ to $M_n$ can be protected by the single protection circuit, even if the above-mentioned wiring between the terminals 21 and 2n is disconnected by a defective contact 12 a connector including any one of the terminals 12 to n2. The input current at the substrate voltage input terminals of MOS-IC's is about several microamperes, so that the above-mentioned wiring may be done by a sufficiently fine and thin film.

According to the present invention, the following advantages are achieved:

(1) Due to the provision of the protection circuit, it is unnecessary to take into account the sequence of the connections of the main and substrate voltages. As a result, a stable operation of the memory can be achieved by using the power source of comparatively lower reliability;

(2) The protection circuit can consist of small-sized parts and built in a common substrate together with control circuits used for the memory;

(3) A number of memories can be protected by a single protection circuit of simple circuit construction.

What is claimed is:

1. A memory circuit with a protection circuit, comprising:
   a memory circuit having first and second voltage input terminals to which first and second voltages are supplied, said memory circuit operating in response to said first and second voltages, said memory circuit comprising a plurality of MOS-IC memory elements whose substrate input terminals are connected in series to be supplied with said second voltage and whose main voltage terminals are connected to each other to be supplied in parallel with said first voltage,
   a comparator connected to said second voltage input terminal and generating a control signal when the voltage at said second voltage input terminal is below a given level; and
   a switching circuit connected between said first voltage input terminal and said memory circuit and responsive to said comparator for cutting off said first voltage when said control signal is generated, whereby said switching circuit may be opened when a voltage at said second voltage input terminal falls below said given level.

2. A memory circuit as claimed in claim 1, wherein said switching circuit comprises
   a first transistor having its emitter to collector path in series between said first voltage input terminal and said memory circuit, and
   biasing means connected between the base of said first transistor and said first voltage input terminal for providing a forward bias between the emitter and base of said first transistor, said control signal from said comparator being applied to the base of said first transistor to remove said forward bias when said second voltage input terminal is below a given level.

3. A memory circuit as claimed in claim 2, wherein said comparator comprises
   second and third transistors connected so that conduction of said second transistor prevents the conduction of said third transistor, said second voltage input terminal being connected to the base of said third transistor, and
   a source of reference voltage at said given level connected to the base of said second transistor, the collector to emitter path of said second transistor being connected to the base of said first transistor and forming part of said biasing means when said second transistor is conducting, said second transistor ceasing conduction and said third transistor conducting when the voltage at said second voltage input terminal is below said given level.

* * * * *